United States Patent [19]

Rose

[11] Patent Number: 5,126,565
[45] Date of Patent: Jun. 30, 1992

[54] ENERGY FILTER FOR CHARGED PARTICLE BEAM APPARATUS

[75] Inventor: Harald Rose, Darmstadt, Fed. Rep. of Germany

[73] Assignee: U.S. Philips Corp., New York, N.Y.

[21] Appl. No.: 741,030

[22] Filed: Aug. 6, 1991

[30] Foreign Application Priority Data

Aug. 8, 1990 [EP] European Pat. Off. ........ 90202152.6

[51] Int. Cl.$^5$ .............................................. H01J 49/48
[52] U.S. Cl. .................................. 250/305; 250/294; 250/296
[58] Field of Search ................ 250/305, 294, 296, 297

[56] References Cited

U.S. PATENT DOCUMENTS 3,061,720 10/1962 Ewald .............................. 250/305
3,766,381 10/1973 Watson ............................. 250/305
4,845,361 7/1989 Ibach et al. ....................... 250/305

Primary Examiner—Jack I. Berman
Assistant Examiner—Kiet T. Nguyen
Attorney, Agent, or Firm—William L. Botjer

[57] ABSTRACT

An energy selecting filter comprising a structure of four hemispheres to be transpassed successively by a beam of charged particles to be filtered. The structure is symmetrically with respect to a plane of symmetry in which the energy selecting element, such as slit or a knife-edge is introduced. In a charged particle beam apparatus such as a high resolution electron microscope the energy spread introduced by a source can adjustable be reduced to below for example 0,1 eV without introducing any beam deviation at the cost of only a small lengthening of the apparatus.

13 Claims, 1 Drawing Sheet

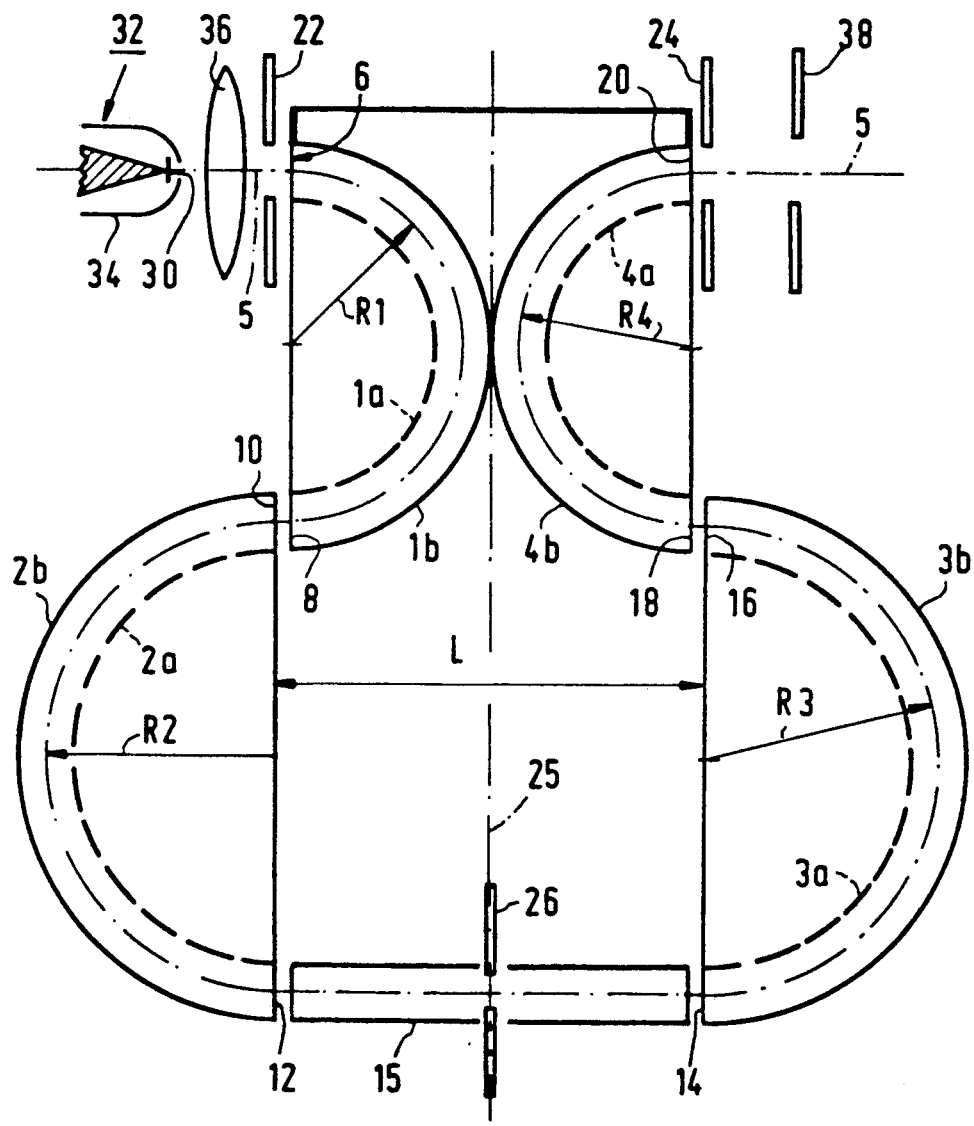

ENERGY FILTER FOR CHARGED PARTICLE BEAM APPARATUS

BACKGROUND OF THE INVENTION

The invention relates to an energy filter for monochromizing a charged particle beam in a charged particle beam apparatus and to a charged particle beam apparatus provided with such an energy filter.

Chromatic aberration is one of the main factors that limits the resolution in charged particle beam apparatus such as ion beam microprobes, low-voltage electron microscopes, high resolution electron microscopes especially when spherical aberration is corrected, electron beam holography apparatus etc.

Chromatic aberration can be corrected for at least in principle with the aid of a quadrupole system or a non-dispersive Wien filter system. Such systems, however, require an extreme stability of the electro-magnetic fields so that practisising has not been realised up to now. A monochromator comprising a system of cylindrical mirror analyzers has also been proposed, a drawback thereof is the low dispersion obtainable in a filter with an acceptable lengthening of the apparatus to be corrected

SUMMARY OF THE INVENTION

It is an object of the invention to provide an energy filter in which said drawbacks are avoided or substantially reduced. To achieve this, an energy filter of the kind set forth in accordance with the invention is characterized in that the filter comprises four basically hemispherically shaped condenser structures being arranged symmetrically on both sides of a plane of symmetry within the filter, each condenser comprising an outer hemispherical electrode and an inner hemispherical electrode to be connected to different potentials respectively.

With the structure an acceptable dispersion can be realised within an acceptable lengthening of the apparatus and stability requirements are substantially less pertinent here due to the fact that the filter is purely electrostatic.

A preferred embodiment of a filter constitutes as a whole a non-dispersive, telescopic charged particle device such that in fact no actions are active onto the particle beam apart from an image shift in axial direction with the desired monochromatization of the particle source.

In a further embodiment energy selecting means are located in the region of the plane of symmetry in the filter. Although the location of the selecting means within the filter is not very critical, positioning in the plane of symmetry combines the advantages of largest dispersion, optical symmetry and simple structure.

In a further embodiment a filter is provided in front and behind it with voltage adjustable screenings. With the aid thereof a mean voltage for the filter can be chosen such that the functioning thereof is optimized. It is further possible with the aid of voltages applied to the inner and the outer electrode of each condenser to correct for small construction defaults by introducing a small voltage difference. Preferably the voltages are chosen in such a way that the potential of the curved optic axis throughout the entire filter coincides with the potential of the screenings.

In a further embodiment charged particle optical means are provided in front of the filter in order to image the particle source in a plane within the filter where energy selecting means are provided thus preferably in the plane of symmetry.

Imaging the particle source into the plane of energy selection results in a maximizing of the current of the filtered beam after passing through a selecting opening. If this plane coincides with the plane of symmetry potential beam deviation in the first filter half will be compensated for in the second filter half.

In a further embodiment the four pairs of hemispheres are arranged such that a cross section thereof constitutes, running with the beam to be corrected a mirror S-shape a straight connection tube and an S-shape, the straight connecting tube in fact forming a bottom of a vase-shaped structure and carrying in its centre the plane of symmetry. The four condensers may have the same structure having the advantage that in principle only two voltages are needed, a first for the inner hemispheres and a second for the outer hemisphere.

Should any astigmatism occur in the beam of charged particles a stigmator can be introduced in a field free region thereof for example between the second and the third condenser or behind the fourth condenser.

An energy filter as disclosed can be used in charged particle beam apparatus as listed and should preferably be introduced direct to the particle source to which normally a lens system is added which can be used for imaging the source onto the selecting means. An usual beam imaging system, without further amendments, can follow the filter. Such an apparatus is preferably provided with a particle source combining a high beam current density with a relatively small energy spread such as a p-n emitter, a field emitter etc. The filter delivers a very coherent beam source and thus has special advantages for high resolution imaging, holographic imaging, in electron or ion microscopes etc.

BRIEF DESCRIPTION OF THE DRAWING

Some embodiments of the invention will be described in more detail with reference to the accompanying drawing showing a single FIGURE.

DETAILED DESCRIPTION OF THE PREFERRED EMBODIMENT

A filter as shown in the drawing provides four pairs of hemispherical structures $1a$, $1b$, $2a$, $2b$, $3a$, $3b$ and $4a$, $4b$ respectively. An entrance opening 6 of the first hemisphere is adapted to the direction of a charged particle beam 5 to be monochromized. To an exit opening 8 of the first hemispherical condenser $1a$, $1b$ an entrance opening 10 of the second hemispherical condenser is connected such that a cross section, as illustrated, constitutes a mirrored S shaped figure.

Due to this arrangement an exit opening 12 of the second hemispherical condenser $2a$, $2b$ should be coupled to an entrance opening 14 of the third hemispherical condenser by an intermediate straight connection tube 15. To an exit opening 16 of the third hemispherical condenser $3a$, $3b$ an entrance opening 18 of the fourth hemispherical condenser $4a$, $4b$ is coupled; constituting an S shaped cross section forming with the half of the tube 15 a mirror symmetrical structure of the first two hemispheres with the other half of the tube 15, thus together a double S shaped figure. The two condensers $1a$, $1b$ and $4a$, $4b$ can be interconnected structurally with a bow 19. An exit opening 20 of the fourth hemispherical condenser is arranged that the charged particle beam leaving the filter follows its path straight on with respect to the beam path before entering the filter. Although other arrangements may be possible for the four hemispheres this one is very attractive in that no mutual transpassings occur, the required lengthening L in an apparatus is relatively small, measuring about 2 R in which R is the radius of the optic axis within the first and fourth hemispherical condenser, the radii R1 and R4 being identical.

In front of the filter an electrode 22 and behind the filter an electrode 24 is added such that a well defined potential can be introduced in the entrance and the exit region of the filter. In a symmetry plane 25 energy sensitive stopping means 26 are incorporated which may be constructed as a fixed or adjustable slit, a knive-edge preferably located at the side of the higher voltage electrons for beams in which the slope of the energy distribution at the low voltage side is relatively steep or any other selective beam stop.

In a charged particle apparatus an emitting point 30 of a charged particle source 32 with a control electrode 34 can be imaged on the energy selecting means with the help of the usual lens 36. Behind the filter a control electrode 38 is shown for adapting the energy of the particle beam onto a working level for the apparatus.

Basically the electrodes 22 and 24 carry the same voltage but a small difference can be introduced in order to correct electrically for potential construction deviations resulting in beam deviations. If the four condensers all have the same structure they can be electrically short-shunted thus all inner and all outer hemispheres respectively carrying the same potential. If the radii of the hemispheres 1a and 4a differ from the radii of the hemispheres 2a and 3a however a difference in potential for those hemispheres should be introduced. The potential of the tube 15 should be the same as the potential for the screenings 22 and 24 apart from small adjusting potential differences.

I claim:

1. Energy filter for monochromizing a charged particle beam in a charged particle beam apparatus characterized in that the filter comprises four basically hemispherically shaped condenser structures being arranged symmetrically on both sides of a plane of symmetry within the filter, each condenser comprising an outer hemispherical electrode and an inner hemispherical electrode to be connected to different potentials respectively.

2. Energy filter as claimed in claim 1 characterized in that the filter as a whole constitutes a non-dispersive telescopic charged optical device.

3. Energy filter as claimed in claim 1 characterized in that a particle energy selecting slit is located in the region of the plane of symmetry of the filter.

4. Energy filter as claimed in claim 1, characterized in that in front and behind the filter a voltage adjustable screen is provided.

5. Energy filter as claimed in claim 1, characterized in that optical means are provided in front of the filter for forming in a particle beam apparatus an image of a particle source in a plane near to the plane of symmetry in the filter where an energy selecting aperture is located.

6. Energy filter as claimed in claim 1 characterized in that the four condenser structures are substantially hemispheres.

7. Energy selecting filter as claimed in claim 6 characterized in that the four hemispheres constitute in cross-section a double S shape with a straight tube between two, one another facing terminals which tube carries an energy selecting slit.

8. Energy filter as claimed in claim 6 characterized in that the four hemispheres have the same mean radius.

9. Energy filter as claimed in claim 1 characterized in that an electrostatic stigmator is provided in a field free region of the filter.

10. Charged particle beam apparatus provided with an energy filter as claimed in claim 1.

11. Charged particle beam apparatus as claimed in claim 10 characterized in that the apparatus is provided with an electron source having a small emissive surface, a small energy spread in the electrons emitted and a high emission density.

12. Charged particle beam apparatus as claimed in claim 10 characterized in that it is provided with an ion emitting particle source.

13. Charged particle beam apparatus as claimed in claim 10 characterized in that it is provided with charged particle optical means to constitute holographical imaging.

* * * * *